United States Patent [19]

Horstmann et al.

[11] Patent Number: 5,535,223

[45] Date of Patent: Jul. 9, 1996

[54] METHOD AND APPARATUS FOR THE VERIFICATION AND TESTING OF ELECTRICAL CIRCUITS

[75] Inventors: Jens Horstmann, Sunnyvale; James Testa, Mountain View, both of Calif.

[73] Assignee: Sun Microsystems, Inc., Mountain View, Calif.

[21] Appl. No.: 390,827

[22] Filed: Feb. 17, 1995

Related U.S. Application Data

[63] Continuation of Ser. No. 68,985, May 28, 1993, abandoned.

[51] Int. Cl.$^6$ .............................. G01R 31/28; G06G 7/48
[52] U.S. Cl. ........................ 371/27; 364/488; 364/489; 364/578; 395/183.09
[58] Field of Search .................... 364/488, 489, 364/490, 578, 579, 580; 371/23, 27; 324/73.1, 158.1; 395/183.09

[56] References Cited

U.S. PATENT DOCUMENTS

| | | | |
|---|---|---|---|
| 4,698,760 | 10/1987 | Lembach et al. | 364/488 X |
| 4,924,430 | 5/1990 | Zasio et al. | 364/578 |
| 5,051,911 | 9/1991 | Kimura et al. | 364/489 X |
| 5,095,454 | 3/1992 | Huang | 364/488 X |
| 5,105,374 | 4/1992 | Yoshida | 364/488 X |
| 5,197,015 | 3/1993 | Hartoog et al. | 364/488 X |
| 5,210,700 | 5/1993 | Tom | 364/489 |
| 5,222,030 | 6/1993 | Dangelo et al. | 364/578 |
| 5,239,481 | 8/1993 | Brooks et al. | 364/489 X |
| 5,278,769 | 1/1994 | Bair et al. | 364/488 X |
| 5,305,229 | 4/1994 | Dhar | 364/488 X |

*Primary Examiner*—Ellis B. Ramirez
*Assistant Examiner*—Eric W. Stamber
*Attorney, Agent, or Firm*—Blakely, Sokoloff, Taylor & Zafman

[57] ABSTRACT

The system of the present invention provides for the verification and testing of electrical circuits and the generation of the information necessary to interface with computer aided testing equipment to physically test the fabricated circuits. The verification of the circuit is divided into two portions, functional verification and timing verification. Information generated during the verification process using the separate functional and timing verification information are then combined into a core structure from which test vectors are generated in a format compatible with a circuit testing apparatus which physically tests the fabricated circuit. In this format, unit delays previously employed to perform the timing tests are adjusted according to the timing specifications of the components to comply with the setup and hold times specified. Using this process, the test vectors required by the physical test apparatus to physically test a fabricated circuit are generated.

24 Claims, 25 Drawing Sheets

FIG. 4B

```
/************************************************************************
    tvs.h
        header file for tvs (C) Copyright by SUN Microsystems (jens horstmann)

************************************************************************
/* version id
/*
    SccsId[] = "@(#)tvs.h 5.3 12/4/92 21:59:25:
*/

/***********************************************************************/
/* preprocessor                                                         */ include <util.h>

/***********************************************************************/
/* misc unix calls (not declared in .h files)                           */ extern int              pclose();
    extern int              gethostname();

#define MAX_PIN         500             /* max number of pins */
#define MAX_REF         100             /* max number of refs */
#define MSK_BLK         100             /* dyn alloc mask blk size */
#define MAX_BIT         5*MAX_PIN       /* max number of bits in pat vector */
define MAX_CTV         40              /* max number of ctv files */ define ADJST           1               /* value is relative */
define ABSLT           2               /* value is absolute */
define DNTC            99999.0         /* no value - don't care */ define NO_SYNTX        0               /* yy - no current parse syntax */
define CTV_SYNTX       1               /* yy - ctv file syntax */
#define MOD_SYNTX       2               /* yy - mod file syntax */
#define MSK_SYNTX       3               /* yy - msk file syntax */
define SLI_SYNTX       4               /* yy - sli file syntax */ define SO              1               /* setup time only (ignore hold time) */
define HO              2               /* hold time only (ignore setup time) */
define SH              3               /* setup and hold time */ define PREV            1               /* shift vec column to previous cyc */
define CURR            2               /* dump current cycle to tpg vec file */ define RZ              10              /* timeset spec -> return to zero */
define RTX             11              /* timeset spec -> ret to complmnt */
#define DNRZ            12              /* timeset spec -> delayed NRZ */
define STB             50              /* timeset spec -> strobe */ define OPEN            10              /* pat_gen() mode -> open */
define DUMP            11              /* pat_gen() mode -> dump */
#define CLOSE           12              /* pat_gen() mode -> close */
#define VLG             30              /* pat_gen() type -> verilog file */
#define TPG             31              /* pat_gen() type ->TPG (ATT) file */
#define PAT             32              /* pat_gen() type -> PAT (LSI) file */
define TPT             33              /* pat_gen() type -> TPT (LSI) file */ define MSK_OFF         0               /* if msk expr true turn mask OFF */
define MSK_ON          1               /* if msk expr true turn mask ON */
#define MSK_UCND        10              /* mask pin unconditionally */
#define MSK_EXPR        20              /* pin conditionally by expression */
```

FIG. 4C

```
#define EX_0            10000              /* expression value '1' */
#define EX_1            10001              /* expression value '0' */
define EX_Z            10002              /* expression value 'Z' */ define NOSIG           0                  /* index - no signal, no reference */ define DEFAULT_LOAD    35.0               /* default cap load = 35pF */
define SIG_DLY         0.0                /* TPT/PAT assertion delay */
#define MAX_SIM_TIME    40000000.00        /* max simulation time in SCL file */
#define DUMMY_CELL      "&BT4(NC/0/=A,NC/1/=EN,NC/0/=TN)"
                                           /* dummy cell for net file */
define TMP_PRFX        "TVS_"             /* prefix for tmp signals in NDL */ define Dbg_Typ(t)      (strstr(opt.dbgtyp, t)!=NULL) ? TRUE : FALSE define min_t(a, b)     (a == DNTC || b == DNTC) ? DNTC : ((a < b) ? a : b)
define max_t(a, b)     (a == DNTC || b == DNTC) ? DNTC : ((a < b) ? a : b)
/*****************************************************************/
/* globals                                                       */
typedef struct pin_adj                     /* timing of adj pin */
{
    char       name [MAXL];                /* pin name */
    double     ts,                         /* adj setup-time */
               th,                         /* adj hold-time */
               to;                         /* adj out-strobe-time */
    int        ts_typ,                     /* adj setup-time type */
               th_typ,                     /* adj out-strobe-time type */
               to_typ;
} Adj;

typedef struct pin_data                    /* signal pin info structure */
{
    char       *name,                      /* pin name */
               *pi,                        /* start location in pat vector (in) */
               *po;                        /* start location in pat vector (out) */
    int        refi,                       /* reference pin index - in */
               refo,                       /* reference pin index - out */
               edgi,                       /* rise/fall/both edges - in */
               edgo,                       /* rise/fall/both edges - out */
               typ,                        /* IN, OUT, BID */
               dir,                        /* direction for current vector */
               msk,                        /* msb number of signal */
               lsb,                        /* lsb number of signal */
               sz,                         /* pin size (width) */
               tmgtyp,                     /* timing set type (SO/HO/SH) */
               tstcyci,                    /* effective test cycle (PREV, CURR) */
               tstcyco,                    /* same but for outputs */
               msk,                        /* mask enable & mask on/off */
               capti,                      /* capacitive type input (TTL/CMOS) */
               capto;                      /* capacitive type output .. */
    double     capi,                       /* capacitive loading (pF) - in */
               capo,                       /* capacitive loading (pF) - out */
               ts,                         /* setup time (time units) */
               th,                         /* hold time */
               to_bc,                      /* output strobe time best case) */
               to_wc:                      /* output strobe time (worst case) */
} Pin;

typedef struct ref_data                    /* reference pin info structure */
{
    char
               *name,                      /* pin name */
```

FIG. 4D

```
                        *pi,                  /* start location in pat vec (in) */
                        *po;                  /* start location in pat vec (out)*/
        int             chk,                  /* entry check flag (opt vs ctv) */
                        nxt_e,                /* next scheduled edge (RIS/FAL) */
                        en;                   /* enable ref-transmit for curr time */
        double          td,                   /* initial-delay time */
                        tc,                   /* cycle-time */
                        thi,                  /* hi-time */
                        nxt_t;                /* next schedule edge time */
} Ref;

typedef struct ctv_data                       /* ctv file info structure */
{
        char            fn_ctv[MAXL],         /* vector input file name */
                        *vector;              /* ctv file version */
        double          ts_ctv;               /* ctv file start times */
} Ctv;

typedef struct tpt_que                        /* tpt queue data structure */
{
        struct tpt_que  *np;                  /* ptr to next queue element */
        double          t;                    /* event time */
        int             pi;                   /* pin index (for dbg only) */
        char            pat[MAX_BIT],         /* scheduled pattern */
                        *pp;                  /* scheduled pin (pat pointer) */
} TPTEvq;

typedef struct msk_data                       /* signal mask data structure */
{
        struct msk_data *nd;                  /* pointer to next data element */
        struct msk_expr *me;                  /* pointer to mask expression */
        double          td;                   /* activation delay */
        char            pv;                   /* previous value of expression */
        int             pi[MAX_PIN],          /* masked pins (pin index) */
                        typ;                  /* mask type (MSK_ON/MSK_OFF) */
} MskDat;

typedef struct msk_expr                       /* signal mask queue structure */
{
        struct msk_expr *nl,                  /* pointer to left node in tree */
                        *nr;                  /* pointer to right node in tree */
        int             sil,                  /* signal/constant index (left) */
                        bl,                   /* signal bit (if signal is bus) */
                        bl_chk,               /* signal bit range check flag */
                        sir,                  /* signal/constant index (right) */
                        br,                   /* signal bit (if signal is bus) */
                        br_chk;               /* signal bit range check flag */
        char            *pl,                  /* direct pointer to value - tbd */
                        *pr;                  /* direct pointer to value - tbd */
        int             op;                   /* logic operator */
        char            *doc;                 /* equation text for debug purposes */
}MskExp;

typedef struct msk_queue                      /* signal mask queue structure */
{
        struct msk_queue *np;                 /* ptr to next queue element */
        double           t;                   /* event time */
        MskDat           *mdp;                /* pointer to mskd entry (for sig) */
}MskEvq;

typedef struct tset_data                      /* reference pin info structure */
{
        int             typ;                  /* RZ, RTX, DNRZ, STB */
        double          td,                   /* delay (for RZ, RTX, DNRZ, STB) */
```

FIG. 4E

```
                        tw;              /* width (for RZ, RTX) */
} Tset;

typedef struct opt_data           /* command line option info struct */
{
        char    mod[MAXL],        /* module name */
                tbl[MAXL];        /* time block (string) */ int     a;                /* -a flag */
        Adj     adj[MAX_PIN];     /* data struct for timing adj pins */
        int     adjc;             /* adjusted-pin count */ int     bn;               /* -bn flag */
        char    bns[MAXL];        /* bus notation string */ int     bus;              /* -bus flag */ int     cmd;              /* -cmd flag */
        char    fn_cmd[MAXL];     /* tvs command file */ int     cmt;              /* -cmt flag */ int     ctv;              /* -ctv flag */ int     dc;               /* -dc flag */
        char    dcell[MAXL];      /* dummy-cell name (LSI's NDL) */ int     dsp,              /* -dsp flag */
                dsp_all;          /* display all signals in dsp list */
        double  dsp_t;            /* display strobe time */ int     err;              /* -err flag */
        int     errs;             /* max error count (simulation) */ int     i;                /* -i flag */ int     ic;               /* -nic flag */ int     l;                /* -l flag */
        char    fn_sli[MAXL];     /* input load file */ int     m;                /* -m flag */
        char    fn_mmp[MAXL];     /* motive timing model file */ int     msk;              /* -msk flag */
        char    fn_msk[MAXL];     /* output-mask info file */ int     nc;               /* -nc flag */ int     net;              /* -net flag */
        char    fn_nti[MAXL];     /* org netlist */ int     nn;               /* -nn flag */ int     nx;               /* -nx flag */ int     pass;             /* -pass flag */
        char    fn_pwd[MAXL],     /* passwd file name */
                *passed;          /* pointer to pass word */ int     ref;              /* -ref flag */ int     scl;              /* -scl flag */
```

FIG. 4F

```
        int         sif;                    /* -sif flag */
        char        fn_sif[MAXL];           /* scl header include file */ int         sig;                    /* sig flag */
        char        fn_sig[MAXL];           /* lwave signal list file */ int         sl;                     /* -nsl flag */
        double      load;                   /* loading (pF) - by default 35 pF) */ int         tif;                    /* -tif flag */
        char        pid[MAXL],              /* Project ID */
                    pkg[MAXL];              /* package name */ int         tpg;                    /* -tpg flag */ int         tpt;                    /* -tpt flag */ int         tst;                    /* -tst flag */
        char        tester[MAXL];           /* tester name */ int         v;                      /* -vl flag */ int         z;                      /* -z flag */ int         stdi;                   /* '-' flag */ int         d;                      /* -D flag */
        char        dbgtyp[MAXL];           /* debug type (tbd) */ char        fn_log[MAXL],           /* tvs log (protocol) file */
                    fn_nto[MAXL],           /* modified netfile */
                    fn_dsp[MAXL],           /* display file name */
                    fn_lsv[MAXL],           /* VPAT (lsave) output file */
                    fn_pat[MAXL],           /* pattern file */
                    fn_scl[MAXL],           /* scl file */
                    fn_slo[MAXL],           /* sysload file */
                    fn_tif[MAXL],           /* tester interface format file */
                    fn_tpt[MAXL],           /* timed pattern file */
                    fn_vpt[MAXL],           /* expected result pattern */
                    fn_vlg[MAXL],           /* verilog statement file */
                    fn_vvc[MAXL],           /* verilog vector file (pattern) */
                    fn_tpg[MAXL],           /* TPG (ATT) control file */
                    fn_vec[MAXL];           /* TPG (ATT) vector file */
} Opt;
                                            /* yy parser related data structure */
typedef struct yy_data
{
        int         dbg,                    /* enable debugging */
                    err,                    /* number of parse errors */
                    eof,                    /* force eof condition */
                    setup,                  /* tell yylex to do io setup */
                    syntx,                  /* active yy syntax */
                    line;                   /* parsed line count */
        FILE        *fp;                    /* current file pointer */
        char        *fn,                    /* current file name */
                    lbuf[MAXLL+2],          /* current line buffer */
                    cmt[MAXL];              /* comment buffer */
} YY_data;
/************************************************************************/
/* include external definitions from source files                       */ ifndef _tvs_yy                 /* allow in all sources except in tvs_yy . y */
include "tvs_yy . y . h"
       include "tvs_yy . c . h"
endif include "tvs . c . h"
include "tvs_utl . c . h"
#include "tvs_utl . c . h"
#include "tvs_be . c . h"
#include "tvs_ls . c . h"
#include "tvs_vl . c . h"
#include "tvs_lx . c . h"
```

```
/*      Sample CTV (Chip Test Vector) file
        (C) Copyright Sun Microsystems 1992      J. Horstmann
/*
/*      Test vector version number which will be copied into TVS
   result files
/*
VecVer    "SCCS Rev 4 / V4.0.2";
/*        List of chip pins
/*
Pinlist   Ref   CLK;        /* clock pin (reference) */
          Input
                IA[4];      /* 4 bit wide input bus (IA.3 .. IA.0)*/
          Output
                OA[3:0];    /* 4 bit wide output bus (OA.4 .. OA.1) */

Input  IB[1:0];   /* 2 bit wide input bus */
          Bidir  OB[2];     /* 2 bit wide bidirectional bus */

Input  IC;        /* input */
          Output OC;        /* output*/
/*
          List of input/output/bidirectional vectors:
          - format convetions:    default    decimal
                                  Ob<val>    binary (0,1,Z,X)
                                  Ox<val>    hexadecimal (0,..,F,Z,X)

- fields are in the order as they appear in the Pinlist
          - the direction of a bidirectional pin is specified using a ":i"
            (for input) or ":o" (for output) following the data field
*/
VectorList
/*
C  I   O     I    O      I O
L  A   A     B    B      C C
K
*/
1  0x0 0x0   0bXX  0bZZ:i  X X ;
0  0x1 0x1   0bXX  0bZZ:i  X X ;

1  0x2 0x2   0b00  0bKK:i  0 1 ;
0  0x3 0x3   0b00  0bKK:i  0 1 ;

1  0x4 0x4   0b00  0b01:i  1 0 ;
0  0x5 0x5   0b00  0b01:i  1 0 ;

1  0x0 0x0   0b11  0b11:o  0 0 ;
0  0x1 0x1   0b11  0b11:o  0 1 ;

1  0x2 0x2   0b11  0b00:o  0 1 ;
0  0x3 0x3   0b00  0b00:o  0 1 ;

/*  Testvector end - count vectors and use count as checksum
*/  VectorCount 10;
```

FIG. 5B

```
# This model is based on down bin spec...

MODEL:          CHIP
DESCRIPTION:    test chip to show MMP example

PINDEF    PGA  PINS

#------------------------------------------------------------------------
# Outputs/Birdirs -    clock-to-Q-delays

# rising-edge   to   oin        low->high           high->low
of clock                      bc      wc          bc      wc DELAY R %CLK  =TO  %OC  90.0    90.0    90.0    90.0
DELAY R %CLK  *TO  %OA  90.0    90.0    90.0    90.0
DELAY R %CLK  *TO  %OB  90.0    90.0    90.0    90.0

#------------------------------------------------------------------------
# Inputs/Bidirs  - setup/hold time

#       pin         to rising-edge    set-up       hold
#                   of clock          1->h  h->1   1->h  h->1

SETHLD %IA    *TO R %CLK    6.0   6.0     6.0   6.0
SETHLD %OB    *TO R %CLK    5.0   5.0     5.0   5.0
SETHLD %IB    *TO R %CLK    5.0   5.0     5.0   5.0
SETHLD %IC    *TO R %CLK    5.0   5.0     5.0   5.0

END_MODEL
```

FIG. 5C

```

# CHIP.cmd:      simple TVS command file to apply a list of options to TVS

(C) Copyright Sun Microsystems 1992                           J.Horstmann chip name and time block

CHIP 1A reference signal definition  (Tdly    Tcycle Thigh)

-ref   clk   40    100   30 adjust input timing (set Tsetup to 10ns, set Thold to full cycle)

-a      $INPUTS 10.0  x adjust outputs timing (Tstrobe to 50ns)

-a      $OUTPUTS 50 adjust bidirectional timing (see input/output above)

-a      $BIDIRS 10.0 x  50 use CHIP.msk file as masking command file

-msk  CHIP.msk put code in the simulation control file that aborts the simulation
after more than 80 pattern mismatches

-err  80 use input pattern file "test.ctv"  (CTV stand for chip test vector)

-ctv  sample.ctv
```

FIG. 5D

```
/*      CHIP.msk:   simple TVS mask file (C) Copyright Sun Microsystems 1992          J. Horstmann
*/
/*      turn mask on for all outputs and bidirectional pins in output mode
        from 0.0ns to 30.0ns
*/

0.0 ns - 30.00ns            $OUTPUTS,$BIDIRS;

/*
        turn mask on for output OC if expression "IC==Z" becomes true. Turn
        the mask off if expression  "IC==0" becomes true
*/

(ic == Z) - (ic == 0)     OC;

/*
        turn mask for bus OB[] on if signal IA==1 and CLK==1 or input IB==1.
        Since no expression or time is specified to turn the mask off it will stay
        enabled (the pin masked) until another condition turms the mask off
        at a later point in time

*/

(ib || ia && clk) OB [ ] ;

/*
        independent of the current mask state turn the mask for bus OB [ ]
        at time 199.0 ns off

*/

-199.0ns          OB[2];

/*
        mask bus OA for the entire test since we don't care about it in this
        test suite

```
/*
CHIP.spec: simple specification file to apply loading to IO plns (C) Copyright Sun Microsystems 1992 J. Horstmann
*/

PinLoad
{
Cap CMOS 18pF OAD,
OB (1:0);

CAP CMOS 1PF IC;
CAP TTL 1.1PF IBO
}

Tester
{
MaxSpeed 40 MHz;
MaxPins 512;
MaxInTimeSets 6;
MaxOutSkew 0.5ns;
MaxOutSkew 0.5ns;

```
/* Data created on Mon Feb  8 15:16:02 1993  using tvs                          */
/* ---------------------------------------------------------------------------- */
/*                                                       jh@xray                */
/*      @(#)tvs.c  5.3 12/4/92   21:59:26   jh0@Eng.Sun.COM                     */
/* ---------------------------------------------------------------------------- */
/* Pin data dump .. or how tvs sees the world ..                                */
/* ---------------------------------------------------------------------------- */
        1.    OC:
                    type = OUTPUT,     msb = 0,         lsb = 0
                    refi  = N/A,       edgi = N/A,      capi=0.0
                    refo  = CLK,       edgo = R,        capo=35.0
                    capti= N/A,             capto = TTL
                    ts  =  0.0,             th = 0.0
                    tstrobe_bc = N/A,       tstrobe_wc = 50.0
        2.    OA:
                    type =  OUTPUT,    msb = 3,         lsb = 0
                    refi  = N/A,       edgi = N/A,      capi=0.0
                    refo  = CLK,       edgo = R,        capo=35.0
                    capti= N/A,             capto = TTL
                    ts  =  0.0,             th = 0.0
                    tstrobe_bc = N/A,       tstrobe_wc = 50.0
        3.    OB:
                    type  =  BIDIR,    msb = 1,         lsb = 0
                    refi  = CLK,       edgi = R,        capi=0.0
                    refo  = CLK,       edgo= R,         capo=35.0
                    capti= TTL,             capto = TTL
                    ts  =  10.0,            th = N/A
                    tstrobe_bc = N/A,       tstrobe_wc = 50.0
        4.    IA:
                    type  =  INPUT,    msb = 3,         lsb = 0
                    refi  = CLK,       edgi = R,        capi=0.0
                    refo  = N/A,       edgo= N/A,       capo=0.0
                    capti= TTL,             capto = N/A
                    ts  =  10.0,            th = N/A
                    tstrobe_bc = N/A,       tstrobe_wc = 0.0
        5.    IB:
                    type  =  INPUT,    msb = 1,         lsb = 0
                    refi  = CLK,       edgi = R,        capi=0.0
                    refo  = N/A,       edgo= R,         capo=0.0
                    capti= TTL,             capto = N/A
                    ts  =  10.0,            th = N/A
                    tstrobe_bc = N/A,       tstrobe_wc = 0.0
        6.    IC:
                    type  =  INPUT,    msb = 0,         lsb = 0
                    refi  = CLK,       edgi = R,        capi=0.0
                    refo  = N/A,       edgo= N/A,       capo=0.0
                    capti= TTL,             capto = N/A
                    ts  =  10.0,            th = N/A
                    tstrobe_bc = N/A,       tstrobe_wc = 0.0
/* ---------------------------------------------------------------------------- */
/* Total Pin Entries: 6                                                         */
/* ---------------------------------------------------------------------------- */
/* Total Pincount:       14    (I-7    / 0-5  / B-2 )                           */
/* ---------------------------------------------------------------------------- */
```

FIG. 5G

```
/* ------------------------------------------------------------------ */
/* Ref data dump ..                                                   */
/*------------------------------------------------------------------- */

1.   CLK:
                tdly = 40.0,       tcyc = 100.0, this = 30.0
/* -----------------------------------------------------------------*/
/* Total Ref Entries: 1                                          */
/* -----------------------------------------------------------------*/
/*
   CHIP.spec:  simple specification file to apply loading to IO oins (C) Copyright Sun Microsystems 1992           J. Horstmann
*/
Pinload
{
        Cap CMOS        18pF       OA[ ],
                                   OB[ 1:0];

CAP CMOS        1PF        IC;
        CAP TTL         1.1PF IB[ ] ;
}
/* In future realeases TVS will support various tester specifications
   (see example below)

Tester Tektronix
{
        MaxSpeed        40MHz;
        MaxPins         512;
        MaxInTine Sets  6;
        MaxOutTimeSets  2;
        MaxInSkew       0.5ns;
        MaxOutSkew      0.5ns;

NAME
    tvs - test vector strobifier

SYNOPSIS
    tvs  [ -a *signal* [=][+/-]*ts* [[=][+/-]*th*] [[=][+/-]*tst*] [ -cmd *cmd_file* ] [ -cmt ] [ -ctv *ctv_file* ]
         [ -dc *cell* ] [ -dsp [all] ] [ -err *count* ] [-i ] [ -ic ] [ -i *spec_file* ] [ -m *mmp_file*]
         [ -msk *msk_file* ] [ -nc ] [ -net *net_file* ] [ -nn ] [ -nx ] [ -ref *signal td tc [thi]* ] [ -scl ]
         [ -sif *sif_file* ] [ -sig ] [ -sl *load* ] [ -tif *PID package* ] [ -tpg ] [ -tpt ] [ -tst *tester* ] [ -v ] [ -z ]
         [ - ] *module timeblk*

DESCRIPTION
    tvs compiles vectors, timing and loading information to a chip level simulation environment (this documentation will be complete with the next release of tvs).

OPTIONS
    -a *signal(in)* [x][=][+/-]*ts* [x][[=][+/-]*th*]
    -a *signal(out)* [=][+/-]*tst*
    -a *signal(bid)* [x][=][+/-]*ts* [[x][=][+/-]*th*] [=][+/-]*tst*]

Adjust or set timing for *signal* pin and overwrite the default setting extracted from the *mmp_file*. The *signal* name may follow one of the following specifications: (1) *signal* and (2) *group*. Where *group* must be either "$Inputs", $Outputs" or "$Bidirs". Names are case insensitive but must be consistent with *ctv_file* and *mmp_file* signal names. Busses are automatically expanded to the defined width.

For inputs *ts, th* or *x* can be specified. Timing may be given *relative* (using "=" prefix), *absolute* or as x, A 'x' ignores either setup or hold time checking (waveforms change only once per cycle). Outputs are adjusted by providing only *tst*. Bidirects finally can take 3 parameters (or if less are specified, keep their default setting). Parameters *ts, th* and *tst* are read in floating point notation (unit nano seconds) and rounded to the nearest time-unit (0.01ns). The relationship between *signal* pin and reference pin is defined in the *mmp_file* (see also -ref option).

-cmd [*cmd_filed*]
        Read the *cmd_file* for options. The file may contain any option except the '-cmd' option itself. Command line options overwrite conflicting *cmd_file* options. Comments may be included starting with a '#' at any line position and ending at the end of the line. If the *cmd_file* filename is omitted tvs will look for the environment variable TVS-CMD and (if existent) will use its contents as the command filename.

-cmt
        Copy comments from the given ctv file or files (or stdin if '-' is supplied) to the result pattern file on a line by line basis. By default comments are not copied to reduce the size of pattern files.

-ctv *ctv_file*
        Read the *ctv_file* as pattern file rather than the default ctv file (*module*_ctv *timeblk*). If multiple -ctv *ctv_file* options are given, all files will be processed in the specified order. The processing includes signal name consistency check and pattern concatenation. It should be noted that tvs does check for phase discontinuities based on multiple pattern files and will flag problems but does not fix them.

-dc *cell*
        To allow pattern verification during the simulator is running (runtime), the LSI simulator requires the definition of additional signals in netlist and SCL file. A signal definition needs the tri-stated output of a dummy cell. Since cell names change across technologies, this option allows tvs to use the as *dcell* specified statement for such dummy declarations. The default is set to "&BT4(NC/0/=A,NC/1/=EN,NC/0/=TN)".

-dsp [ts] | [all]
        Generate an *expected result* file *module*. DSPLST *version* in LSI's Display List Format (only the 'SIMULATION RESULTS' portion) and *module*, VPAT *version* file for LSI's LSAVE program.

FIG. 6B

Masked outputs or masked bidirects in output mode will have an 'X' entry implying that their value should not be compared. Note that the DSP file contains *one* vector per rising edge of the *first* defined reference signal (-ref option). If a strobetime ts is specified the program will use this time relative to the rising edge of the first defined reference signal in lieu of the default (1ns before the rising edge) for the DSP file timestamps. If the keyword all is specified, tvs will dump all signals (inputs, outputs, bidirects, and bidirect enables) in DSP file format. Unlike in the default -dsp mode, the program will dump a vector on both, the rising and falling edge of the reference signal. The all mode may be used to interface to other CAD tools like TSSI used by Quickturn. The all flag has no influence on the *module*, VPAT *version* file.

-err *count*
: Abort chip level simulation after *count* mismatches between the expected results (*module*.VPT *timeblk*) and simulation results. By default *count* is set to 40 which aborts the simulation at the first pattern mismatch.

-i
: Ask whether existing files should be overwritten or not. By default and if stdin is used as ctv-file input ('-' option), tvs overwrites existing files.

-ic
: Compare inputs and bidirects in input mode as well as pure outputs. By default *only* outputs and bidirects in output mode will be compared and flagged. This option may be used to make sure the chip is not driving data during an expected input phase (in case of bidirectional pins) resulting in signal conflicts. Always applying -ic is not advisable since due to setup, hold and strobe timing, violations may be flagged which aren't violations.

-l *spec_file*
: Change the default tvs specification filename (*module*.mmp) to *mmp_file*.

-msk *msk_file*
: Read the *msk_file* to mask specified output for certain time periods. In case of asynchronous clocks this mechanism allows to mask/ignore unpredictable output values. More details about the mask file format can be found in msk_file (5).

-nc
: No Check. Don't generate code to compare expected and actual simulation results. This feature increases simulation speed and simplifies SCL or Verilog simulation-control files.

-net *net_file*
: Change the default netlist filename (*module*.NET) to *net_file*. The result netlist will be still called *module*.NET and the backup netlist *module*.NET%.

-nn
: No Netlist modifications. By default tvs modifies the top level module (top level module) to declare temporary signals needed to allow runtime result checking in the SCL domain. In some cases (e.g. if this modification had been done already) it may make sense to disable this feature using the -nn option.

-sl [*load*]
: Write a *module*.SYSLOAD file. The chip delay predictor (e.g. LSI's LDEL) will use this file for predict output delays. If no *load* value is given and no spec file entry (see -l option) is found, tvs will assume a default value of 35pF for that particular pin.

-nx
: Supply the data complement instead of 'X' during data-invalid periods. This is useful for tester applications since they provide only '1', '0', or 'Z' but not 'X'. Note that applying the complement isn't as good as 'X' for verification purposes and should only be used when needed.

-ref *signal td tc [thi]*

FIG. 6C

Every signal is specified relative to a reference pin (see mmp_file (5)), e.g. a signal 'clock'. The definition of those reference pins is different from normal I/O-pins and not provided in the timing model file. For the pin *signal* (reference pin) an initial delay *td* (counting from time 0), a cycle time *tc* and a high time *thi* may be specified. Parameters *td*, *tc* and *thi* are declared with *td* = 0, *tc* = 25.0 and *thi* = 12.5.

-scl  Create only a SCL file (*module.SCLtimeblk*) and don't touch the pattern file. This has the advantage of changing just the simulation control file (fast turn around) without updating a big pattern file (several mega bytes). The -tpt option always creates a new SCL and TPT file and ignores the -scl setting.

-sif *sfile*
  Include *sfile* in the SCL file header. This can be used to apply special SCL commands, like DISPLAY for a pattern dump (see also *SCL reference*).

-sig  Generate 'siglist' file (*module*.signlist) for LSI's LWAVE program. All inputs, outputs, and bidirects are listed in the order specified in the 'ctv' file (*module.ctvtimeblk*). Prior to creating this file, tvs copies an existing 'siglist' file to a backup file, called *module*.siglist%.

-tif *PID package-type*
  Generate TIF (Tester Interface File *module*.TIFv file) and assume *tester* as tester type (see -tst option). tvs will look up the *module*.spec file to determine tester parameters (i.e. void times, number of timesets, etc). The *module*.TIFv file contains chip pinout information (which tvs reads from the *PID*.BDCMD file), pin timing and potential mask statements (see -msk option) needed for LSI's LTEST program.

-tpg  Generate TPG2 file (*module.TPGtimeblk*) using AT&T's GSIM language. The output may be used in conjunction with AT&T's program "Magic" to generate Verilog timing shells compliant with AT&T's design sign-off conventions. TVS will also generate a TPG2 specific vector file (*module.TPGVECtimeblk*) containing input, expected output, and directionality information for bidirects.

-tpt  Create TPT file (*module.TPTtimeblk*) rather than a PAT file. The TPT file contains 'timed' pattern, it has a set of pattern (line) whenever one or more pins change. Files can be very large if multiple input timesets are used. In contrast the PAT file contains no timing information and uses 2 pattern lines per clock cycle per reference signal.

-tst *tester*
  Assume *tester* as tester type and verify if the current setup (timing, number of pins, etc) agrees with the tester parameters (extracted from the *module*.spec file) for the used tester.

-v  Create output files for a Verilog rather than a LSI Logic chip simulation environment. If -v is supplied, tvs writes timed Verilog statements (assert/deassert/monitor pins) to the *module_sh.v* file. Input pattern will be stored in a PAT file, expected output results in a VPT file. None of the other LSI files will be created or touched. The Verilog shell file instantiates the chip (using *module* as module name) allowing the Verilog simulator to link the design and the testshell.

-z  Compress primary pattern output file (e.g. *module.TPTtimeblk*) using compress(1). A '.Z' will be appended to the default filename to identify the compressed files.

-  Use stdin instead of *module.ctvtimeblk* file to read pattern information. This option may be used to have pipes instead of files, e.g. if data are stored in a compressed format. If '-ctv..' is given, stdin will be processed after reading all specified ctv files.

EXAMPLES
  a simple transfer could look like:
    host% tvs -a $Inputs + 1.2 2.1 -a Pin_Out +-2.3 -ref Clk 0 40 15

FIG. 6D

The program will increase the setup time of all inputs by 1.2ns and set the hold time to 2.1ns absolute. The strobe of output pin 'Pin_Out' will be adjusted by -2.3ns (strobe earlier). The referenced pin (given in timing model file) has no offset (0), a cycle time of 40.0ns and a 'high' time of 15.0ns (non symmetric clock).
To use pre defined translation options, command files may be used. The following scenario would give the same result as the previous example.

```
host% tvs -c typ_cmds
host% cat typ_cmds
# this is a tvs cmd file ...

-a $Inputs + 1.2 2.1          #adjust all inputs
-a Pin_Out +0 +0 -2.3         #adjust 'Pin_Out' strobe time
-ref Clk 0 40 15              #specify reference signal
host%
```

FILES

| | |
|---|---|
| *module*.ctvtimeblk | chip test vector input file |
| *module*.mmp | Motive timing information file |
| *module*.spec | IO specification loading file |
| *module*.NET | chip top level netlist. TVS modifies netlist for 'Isim' run runtime checking). |
| *module*.SCL*timeblk* | LSI Logic's 'Isim' simulation control file |
| *module*.PAT*timeblk* | LSI Logic's 'Isim' pattern file |
| *module*.TPT*timeblk* | LSI Logic's 'Isim' timed pattern file |
| *module*.VPT*timeblk* | Expected pattern result file |
| *module*.TIF*v* | LSI 'ltest' tester interface file |
| *module*.SYSLOAD | LSI Logic's 'Idel' output loading file |
| *module*.log*timeblk* | tvs protocol file |

SEE ALSO compress(1). uncompress(1)
*Simulation Control Language Reference*, LSI Logic Corp.; Milpitas, CA Rel 10.0
*Network Description Language Ref.*, LSI Logic Corp.; Milpitas, CA Rel 10.0
*Simulation and Verification Tools*, LSI Logic Corp.; Milpitas, CA Rel 10.0

ACKNOWLEDGEMENTS tvs is part of Campus2's system simulation and test vector extraction strategy and a product of the *System Simulation Team* Beyond this, special thanks to Craig Forrest and Larry Fiedler who helped with valuable inputs beyond the specification of tvs. Further, the help and inputs of the entire Campus2 team and Sun's, as well as as LSI Logic's Corporate Test Group were very valuable and highly appreciated.

AUTHOR

Jens.Horstmann@Eng.Sun.COM, 415-336-3537.
© 1990 Sun Microsystems Inc.

BUGS

No known bugs.

TIMING MAPPING BETWEEN SYSTEM AND TESTER

TIMING MAPPING BETWEEN SYSTEM AND LOGIC SIMULATION 5,535,223

METHOD AND APPARATUS FOR THE VERIFICATION AND TESTING OF ELECTRICAL CIRCUITS

This is a continuation of application Ser. No. 08/068,985, filed May 28, 1993 now abandoned.

BACKGROUND OF THE INVENTION

1. Field of the Invention

The present invention relates to a system for performing verification and testing of electrical circuits.

2. Art Background

The use of computer aided design (CAD) tools to design and physically test the designed electrical circuits have become quite popular. Using these tools, a circuit designer can develop a circuit, simulate the operation of the circuit to verify the circuit operation and subsequently generate the information necessary for a circuit testing apparatus to test the fabricated circuit.

Before fabrication of the electrical circuit, it is desirable to perform a verification of the operation of the system in order to determine whether the system designed would operate as intended. A variety of tools which perform a verification of an electrical circuit design often referred to as "switched level tools" presently exist, such as SPICE, provided by the University of California, Berkeley; MOTIVE, provided by Quad Design Technology Inc., Camarillo, Calif.; VERILOG, provided by Cadence, Inc., San Jose, Calif. and LSIM, provided by LSI Logic, Milpitas, Calif.

Typically, a simulation will perform a functional analysis and a timing analysis on the circuit. A functional analysis verifies that the logic of the circuit operates as intended. Timing verification determines that the components of the circuit operate within time constraints and are compatible with interconnected components. For example, as shown in FIG. 1a, the circuit may consist of one or more components 10, 15, 20 which communicate, for example, via bus 25, 30, with each other or input or output information.

The advances in circuit technology have rendered many of these tools inefficient and difficult to use. Circuits today are processing signals faster and faster. Signals are communicated along signal lines at very high speeds. However, with high speed signals, the lines interconnecting components can no longer be simply configured by RC modeling to simulate loading, but operate with the characteristics of transmission lines which have varying effects on the circuit timing and therefore must be modeled in order to accurately perform verification. Many logic verification programs are digital in nature and do not have the capability to accurately model a complex analog transmission line.

To address this problem existing tools have been modified to verify both the digital components and analog transmission lines. An example is MBSIM product provided by LSI Logic, Inc., or Verilog PLI provided by Verilog. In these mixed mode or "switched level" tools, a logical or digital verification is sequentially performed on a chip and carried through the analog environment of the transmission line to the input of the next chip at which time a digital or logical simulation is performed. This simulation requires a significant amount of time to perform as the digital and analog testing is serial in nature. Furthermore, the simulation requires a significant amount of memory in order to maintain the various states of the different components in the circuit. Furthermore, the margins which specify the range of time values permitted for each signal have become narrower and thus less forgiving due to the increase in signal speeds. Therefore, the need to accurately and precisely verify a circuits' timing is even more important.

Typically each chip manufacturer has developed a set of tools to assist in the verification of designs using their components. However, compatibility among the different tools by different manufacturers is minimal at best. Previously, this was not a problem because a circuit would only include components provided by a single manufacturer and that, manufacturer's design tools would be utilized. However, today it is not at all uncommon to develop a circuit which includes components from a variety of manufacturers. To overcome incompatibility problems, a circuit designer may develop a behavior model of a component which is not compatible with the tools that are in use. However, these behavior models often do not precisely emulate the component, resulting in unforeseen results when the component is subsequently tested.

The overhead of a prior art system which attempts to perform both timing and functional testing is quite significant. The overhead is incurred due to the sequential nature of the verification operation. Functional and timing verification is performed on each component and interconnect of the circuit. This process is quite slow and requires a significant amount of memory to maintain the information for each component during verification of the circuit. This is better explained with reference to FIGS. 1b and 1c.

FIG. 1b illustrates portions of two components 35, 40 interconnected via a signal line 45 and system clock line 50. Referring to FIG. 1c, in order to verify proper timing between components 35, 40 the signal output by Chip 1 35 must be stable at the input of Chip 2 40 prior to the setup (and hold) time specified for Chip 2 40 and the propagation delay through buffer B2 55. The margin 60 identifies the amount of time between when the output signal is stable at the input of Chip 2 40 and when the output signal is latched by Chip 2 40. To determine the margin, propagation delay through the flip flop 60 and buffer 65 must be determined, as well as the delay caused by transmission line T1 70. Furthermore, the setup and hold time for the input to Chip 2 40 as well as the propagation delay through the buffer B2 55 is factored in.

SUMMARY OF THE INVENTION

The system of the present invention provides for the verification of electrical circuit designs and the generation of the information necessary to interface with computer aided testing equipment to physically test the fabricated circuits. The verification of the circuit is divided into two portions, functional verification and timing verification. To perform the timing verification, the components, or chips that are part of the circuit, are treated as black boxes having unit delays. The functional verification process verifies the function or logic of each component and circuit or system of interconnected components. As the timing component is eliminated, it is preferred that an exhaustive static simulation is performed. An analog circuit timing verification package, such as TLC or SPICE, may be used to verify the timing of the analog circuit comprised of chips having unit delays and transmission line interconnecting the different chips.

The timing and functional verification processes can be performed independently of each other. Based on the results of the independent timing and functional verification, the designers can adjust certain chip and system function and/or timing specifications in order to produce a circuit design that in simulation meets requirements.

Information generated during the verification using the separate functional and timing simulations are then combined into a single uniform or core structure which is easily converted to a variety of vendor specific environments and circuit testing apparatus which physically tests the fabricated circuit. To generate the core structure, the unit delays previously employed to perform the timing tests are adjusted according to chip timing specification setup and hold times specified. From this core structure, the test vectors required by the physical test apparatus to physically test a fabricated circuit are generated.

The advantages to this system are a significant increase in speed, minimal memory usage, and flexibility by enabling the chip designers to work somewhat independently of the circuit or system designers during the simulation and test of the electrical circuit. Less memory is required as the functional testing of the individual components does not have to be carried through the system timing test of the circuit. An increase in speed is achieved because many of the functional verification and the timing verification processes can be performed in parallel. Furthermore, the modularity of the system enables the system to be vendor independent and interface with a variety of vendor specific tools.

BRIEF DESCRIPTION OF THE DRAWINGS

The objects, features and advantages of the present invention will become apparent to one skilled in the art in view of the following detailed description in which:

FIGS. 4A and 4B–4F illustrate the core data structure utilized in the system and method of the present invention.

FIGS. 5A–5H provide simplified examples of a circuit and corresponding vectors list, timing envelope specification, and other information utilized and generated in accordance with the system and method of the present invention.

FIGS. 6a, 6b, 6c, 6d provide an illustrative manual page identifying inputs, outputs and options for the present embodiment.

DETAILED DESCRIPTION

A system for the simulation verification and testing of electrical circuits is disclosed. In the following description for purposes of explanation, numerous details are set forth in order to provide a thorough understand of the present invention. However, it will be apparent to one skilled in the art that these specific details are not required in order to practice the invention. In other instances, well known electrical structures, circuits and systems are shown in block diagram form in order not to obscure the present invention unnecessarily.

Figure 1A:
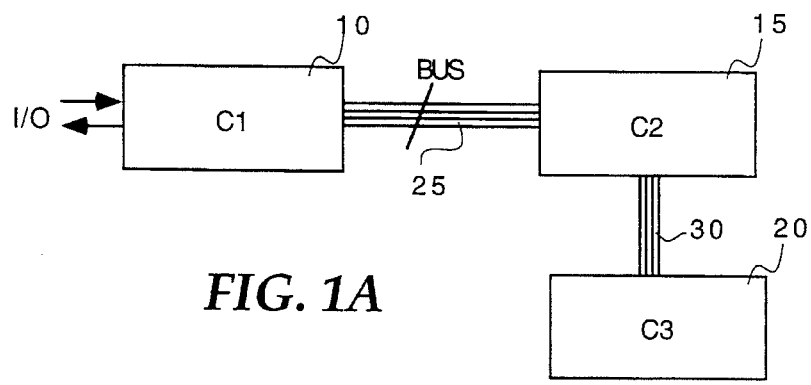
FIG. 1a is a block diagram illustration of an exemplary system to be simulated and tested.
Figure 1B:
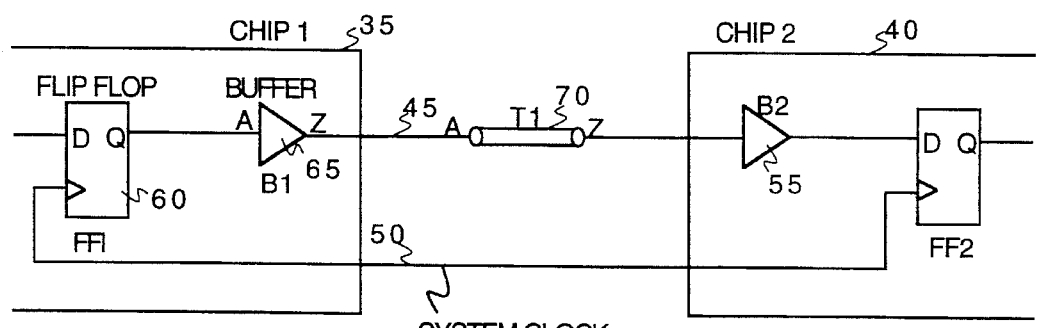
FIG. 1b and 1c illustrate exemplary test considerations for a circuit interconnect.
Figure 1C:
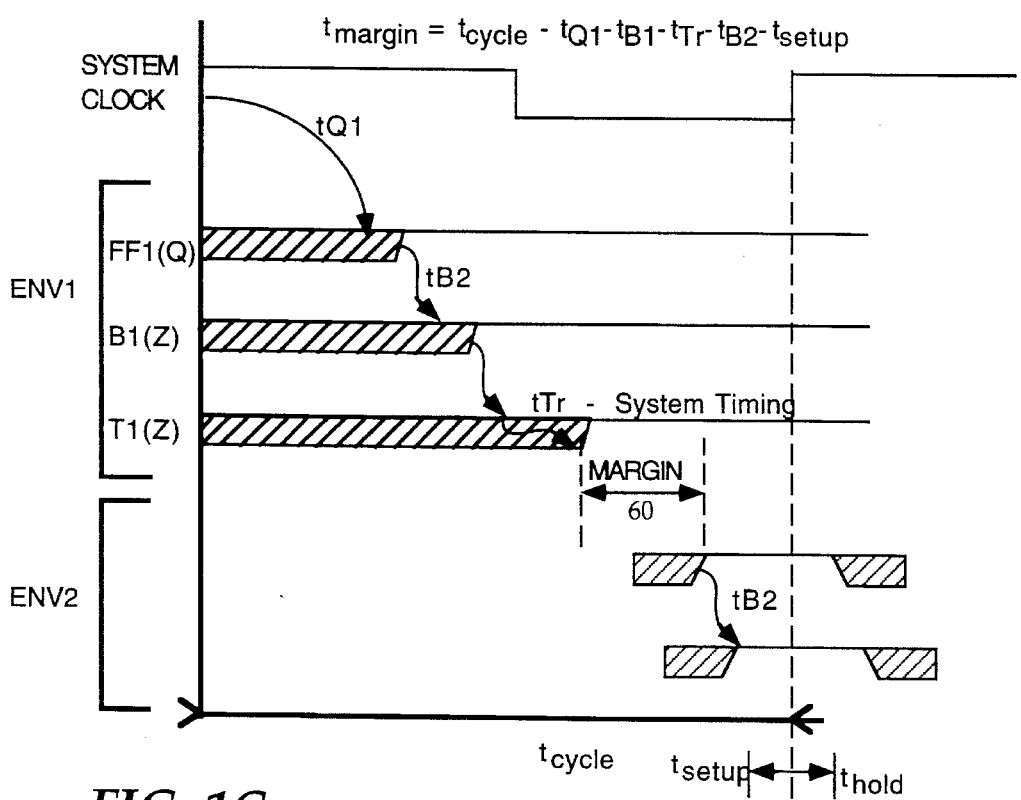
Figure 2:
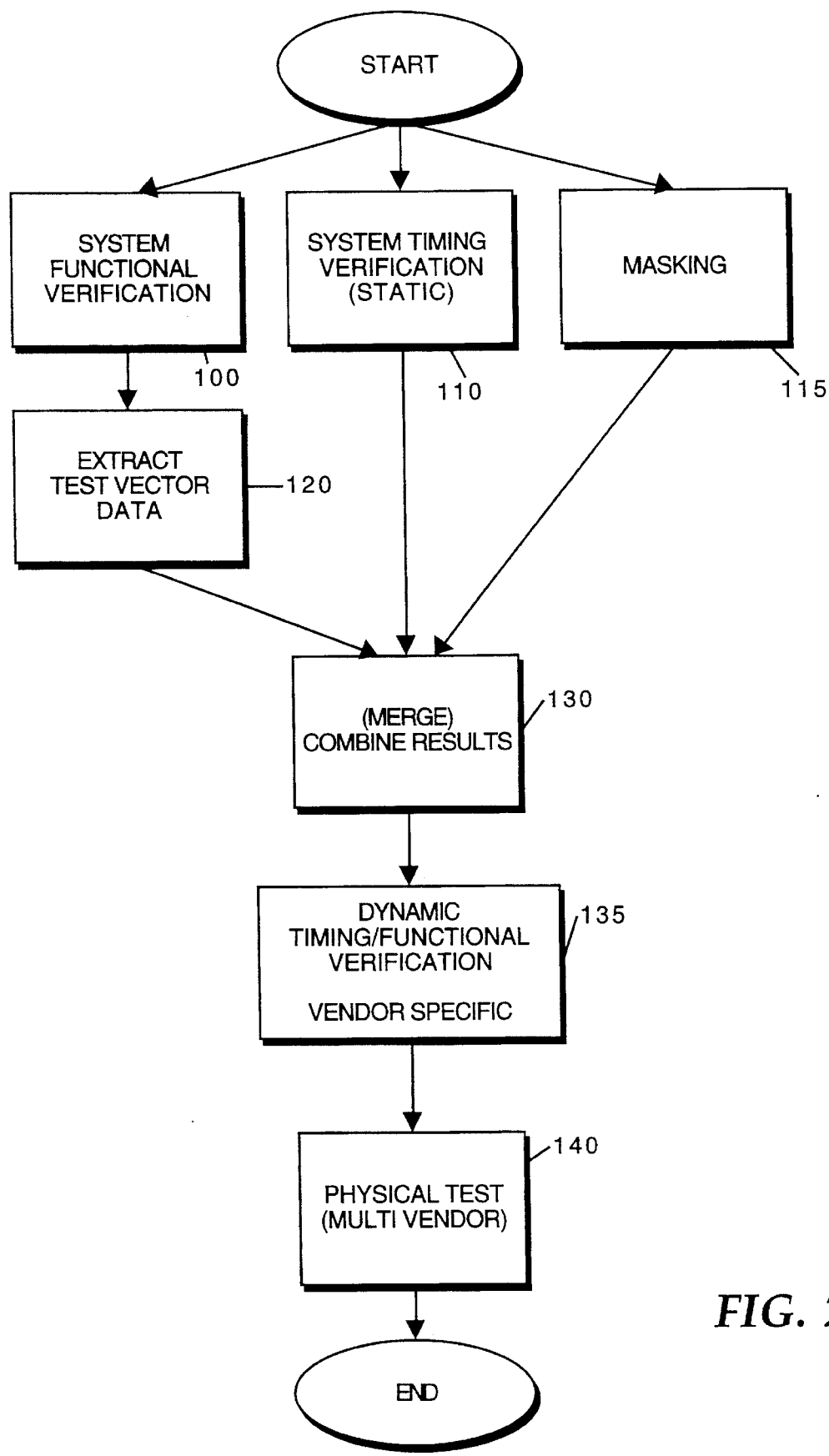
FIG. 2 is a block diagram representation of the process flow for simulation and verification in accordance with the present invention.

The process can be generally described with reference to FIG. 2. The testing of the electrical circuit is divided into two parts: functional verification using functional simulation, step 100, and timing verification of the electrical circuit using static testing, step 110. The functional verification process simulates the circuit from a logic perspective to determine whether the components interact in the manner intended. Information regarding timing is not considered, rather, each element is considered to have a unit delay. Thus, signals will propagate through elements at each reference clock provided as part of the simulation. Functional verification can be performed using commercially available products to test the circuits. Typically, chip vendor specific simulation tools, such as third party tools, are used to test each component. The chip designer, based upon the output of the functional testing, can modify the design accordingly to optimize the functional operation of each component.

Independently of the functional verification, timing verification can be performed, step 110. In order to evaluate the circuit from a timing perspective, each component in the circuit is treated as a black box in which the internal elements of the component are not evaluated; rather, parameters identifying the strobe time and clock-to-output delay (also referred to as the clock-to-Q delay) through the component and the setup and hold times for each component are utilized. Thus, analysis may be focused on the propagation of signals through the circuit as a whole and, in particular, the effects of signal transmission lines on signal propagation. To perform the timing verification, packages such as HSPICE by Meta-Software, San Jose, Calif., may be used. Typically, timing verification is performed by simulating the circuit operations and comparing the timing of valid signals at the inputs of components to the setup and hold times specified in the timing specification for the component. This information is typically maintained in the timing envelope specifications for each of the components of the circuit. The timing envelope specifications are generated based upon such factors as electrical characteristics of transmission lines, bus specifications and chip specifications.

The flexibility achieved by separately verifying the circuit functionally and timing is readily realized. For example, if the timing verification indicates that certain time requirements are not met, the circuit designer can go back to the design and modify the circuit and re-perform in parallel the functional testing and timing testing. This redesign of the circuit will accordingly modify the parameters specified in the timing envelope specification and therefore the parameters as to whether the circuit design meets timing requirements. The chip designers may also modify the chip design or margin requirements for signal timing, which causes modification of the timing envelope specification, in order to meet timing requirements.

As functional testing is performed, test vectors are extracted at each reference clock, step 120, and a chip test vector file (CTV) is generated. These test vectors include an identification of the input/output pins of the component and the logic state of the pins at each clock. The test vectors and the timing envelope specifications are subsequently combined with signal masking information, step 115, into a core data structure, step 130, from which vendor specific data for each chip can be easily generated to perform dynamic timing verification using vendor specific tools, step 135, and timing test vector files which are compatible with test apparatus for the physical testing of the fabricated components, step 140.

Figure 3:
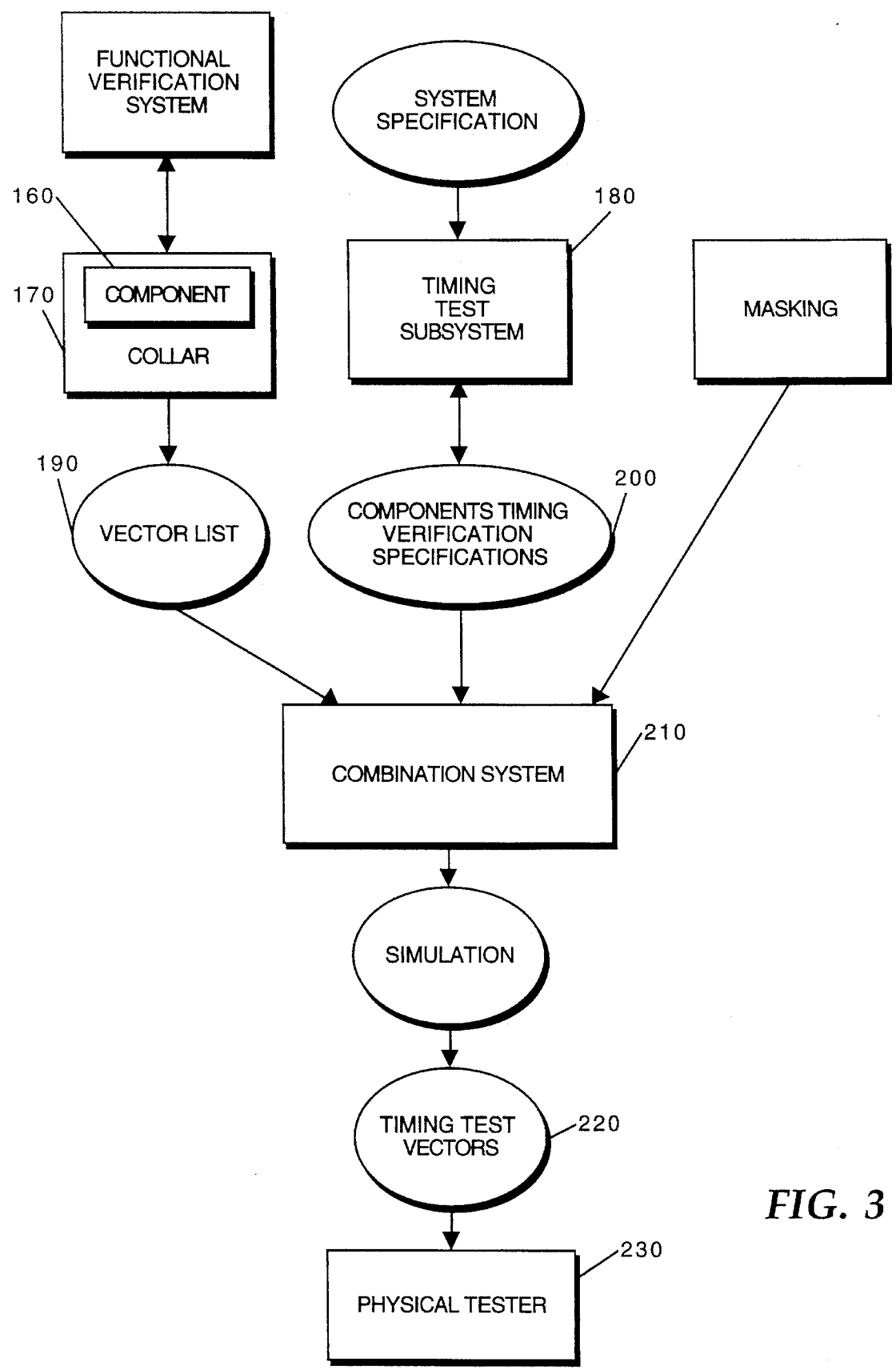
FIG. 3 is a block diagram representation of the system of the present invention for verification and testing.

A block diagram illustration of the system is shown in FIG. 3. The circuit 160 can be embodied in a plurality of different formats and data structures in accordance with the chip manufacturer's formats or system designer's formats for definition of the components and interconnection of the components. For example, the circuit may be defined in accordance with the Motive format specified in the MMP (Motive Model Processor) software provided by Quad Design Technology, Inc, Camarillo, Calif. In the present invention, a collar 170 surrounds each component 160. The collar 170 functions to extract the vector data for the test vector file during verification of each component. This can be easily implemented a number of ways including the reading and writing of certain registers or memory locations identified to be the input/output pins of the simulated component, or by using utilities provided with certain test programs. For example, using the Verilog language, manufactured by Cadence, Inc., the collar can be generated simply by including code to specify at each clock edge (either positive or negative) to write the state of identified pins to a file. Preferably the collar is provided access to the circuit layout file which identifies the input/output pins so that the pin naming is consistent with the pin names identified in the circuit layout file.

The timing verification module of subsystem 180 also utilizes certain circuit information such as the circuit layout identifying the interconnection of components and the characteristics of the interconnect between components and timing envelope specifications 200 for each of the components, and assumes that the timing requirements are as specified by the clock-to-output and setup/hold times specified in each component's timing envelope specification 200. Therefore, actual simulation can be focused, but not the functional aspects of each component, on the clock-to-output delays and signal timing such as effects of transmission lines which occur on signal propagating between components.

If the timing verification indicates that certain timing requirements are not met, a number of things may occur. For example, the chip designer may be required to modify a component's design or timing envelope specification. The system designer may also modify timing margins or the layout of the circuit. The verification-design process can then be performed in an iterative manner until the design is adequately verified.

Once the timing verification and functional verification are complete, the information from the chip test vector file (CTV file) and each component's timing envelope specifications are combined, block 190, to generate chip vendor specific information and a core structure from which the timing test vectors used by the test apparatus which physically tests fabricated components can be generated. As will be subsequently explained, the core data structure is generated by modifying the chip test vector file to include timing information. This timing information is extracted from the timing envelope specifications of the components.

Figure 4A:
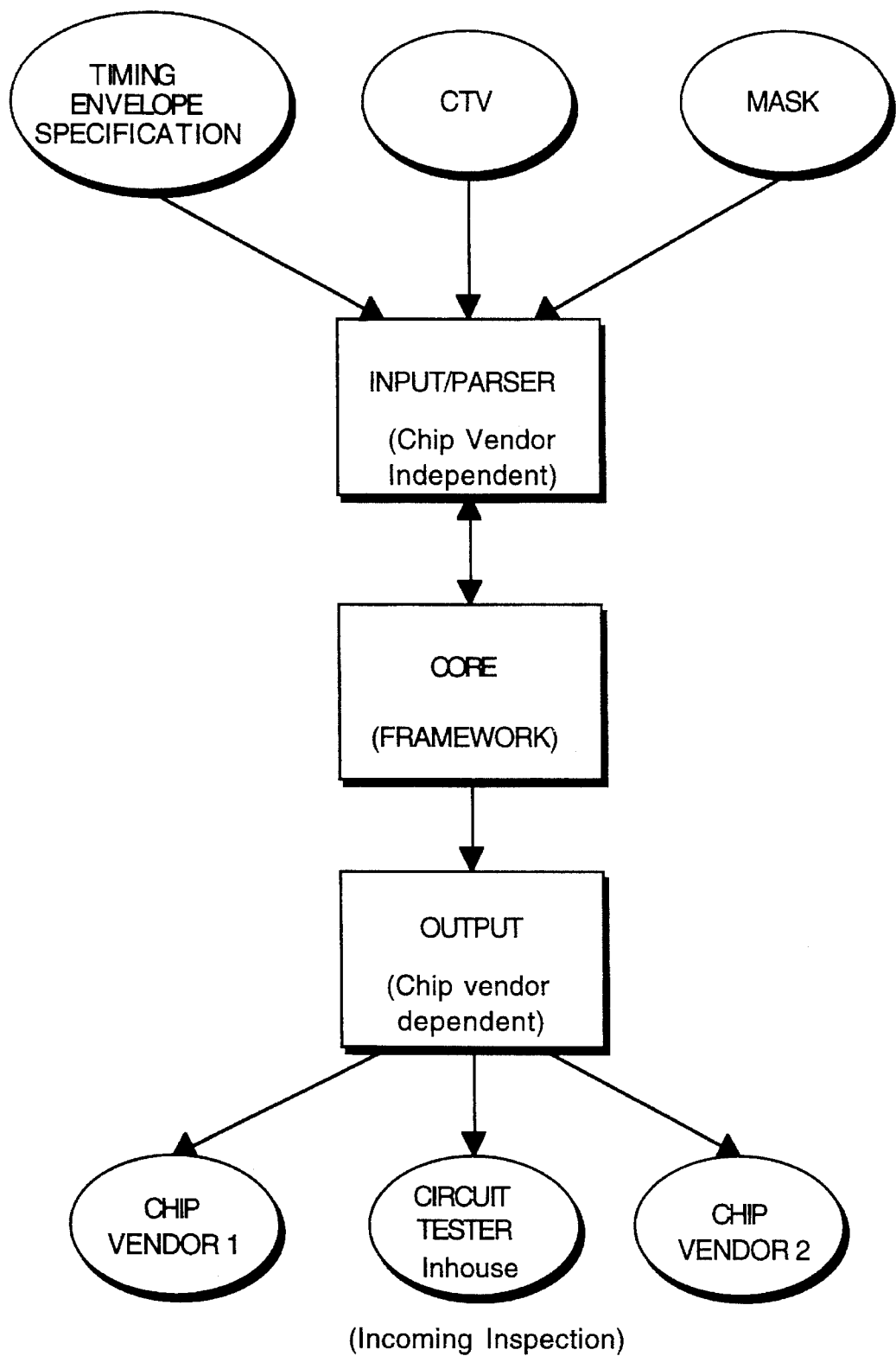

In a preferred embodiment, the combination module itself is modular and can be viewed as consisting of three elements: the input element, core and output element. This is illustrated in FIG. 4a. The input element 445 receives the input data, in the present embodiment, the test vector file 430, the timing envelope specification 435 and masking information 440 and generates the data structure comprising the core 450. The core 450 remains consistent in format for a variety of inputs and outputs. Preferably the core 450 includes the following information such as is shown in FIGS. 4b-1–4b-5. The output module 455 references the core 450 to generate output files 460–465, 470 compatible with vendors of test and design equipment. By modifying the input module and output module to accommodate different vendor inputs, a flexibility to accommodate a variety of testing and simulation conditions is achieved.

Figure 5A:
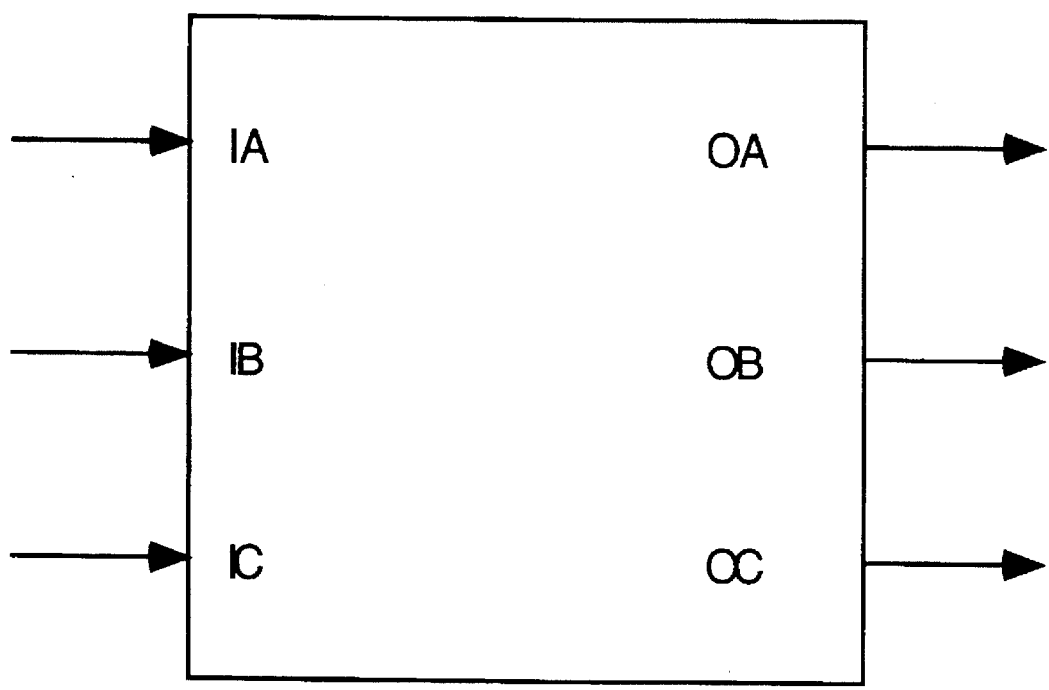

FIGS. 5A through 5H provide a simplified illustration of the data utilized in the system of the present invention. It should be realized that other formats and data structures may be used. FIG. 5a illustrates a simple component having three inputs IA, IB and IC and three outputs OA, OB, OC. FIG. 5b illustrates an exemplary test vector file showing the identification of the input and output pins of the component and the vector list identifying the state of the pins at each reference clock. FIG. 5c is illustrative of a timing envelope specification accessed during the timing test simulation of the circuit. Included in the timing envelope specification is such information as the setup and hold times for each pin and the clock-to-Q delay through component. The test vector file and information from the timing envelope specification, such as the setup and hold times identified with respect to each pin of each component, is used to generate a core data structure, from which a timing test vector file can be generated. In the present embodiment, to initiate the process for combining functional information (test vectors) with the timing information from the timing envelope specifications, a command file, such as illustrated in FIG. 5d is used, a plurality of options, such as those shown in the manual page for the program may be selected. FIGS. 6a–6d are a listing of a manual page for the present embodiment. For example, the input timing and/or output timing can be adjusted as shown in the example of FIG. 5d. Furthermore, a mask file can be identified, as will be explained below, a mask file permits a user to identify certain pin signals to mask dynamically when certain other identified pin signals are in predetermined state. An example of a mask file is shown in FIG. 5e. Another input to the process is a chip specification file to identify loading information for certain testing equipment. For example, as shown in FIG. 5f, the loading on inputs IB, IC and output pins OA and OB are identified. Furthermore, loading can be tester specific whereby loading information can be derived from tester specification. FIGS. 5G and 5H provide a pin data information dump illustrating some of the information collected from the inputs to the combination module.

Figures 7A, 7B, 7C:
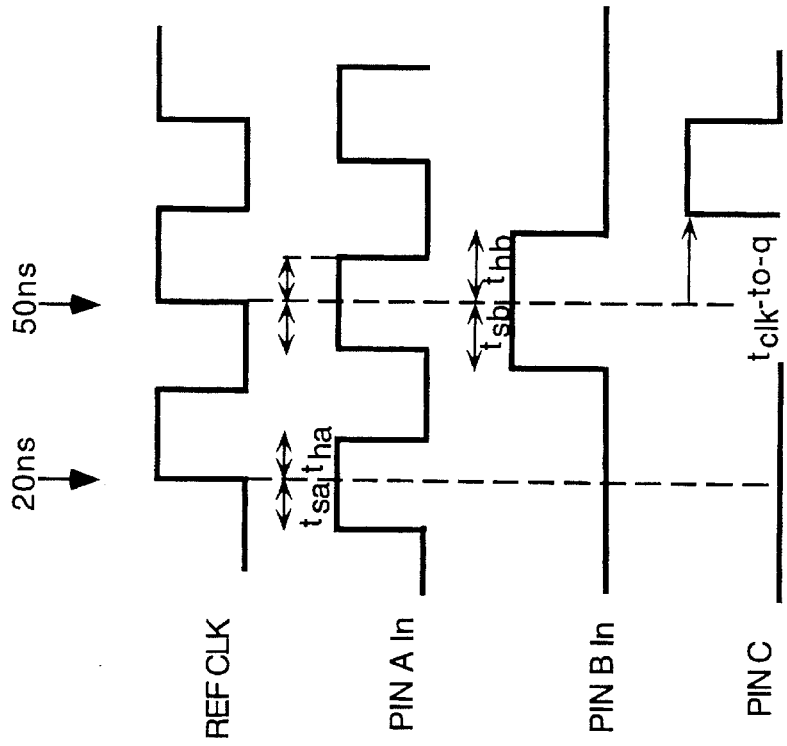
FIGS. 7a, 7b, 7c illustrate the generation of the timing test vector file in accordance with the system and method of the present invention.

The process for combining the functional and timing information will be explained with reference to FIGS. 7a, 7b and 7c. FIG. 7a shows a vector list for two input signals, pins A and B and output pin C. Pin A at a first referenced clock has the state of 1, B has the state 0 and C has a state of zero. At the second referenced clock, both Pin A and Pin B are in a 1 state and C is in a 1 state. From the timing envelope specification, it is known that the Pin A has a setup and hold time of 5 seconds and 3 seconds respectively. Similarly, Pin B has a setup time of 7 nanoseconds and a hold time of 4 nanoseconds. Pin C has a clock to output of 20 nanoseconds. As shown in the table of FIG. 7b and the timing diagram of FIG. 7c, at the first rising edge of the reference clock, which occurs at twenty nanoseconds, the signal at Pin A is adjusted by subtracting 5 nanoseconds, the setup time for Pin A, from the 20 nanoseconds of the referenced clock. Thus, at 15 nanoseconds Pin A has a value of 1. At the end of the hold time, Pin A will be restored to the 0 state. An entry is therefore generated in which at 23 nanoseconds (3 nanosecond hold time beyond the 20 nanoseconds of the clock edge) Pin A reverts to a 0 state.

At the next clock, which occurs at 50 nanoseconds because the clock pulse is at 30 nanoseconds apart, both Pin A and Pin B go to a 1 state. However, they occur at different times. Specifically, Pin A has a setup time of 5 nanoseconds and Pin B has a setup time of 7 nanoseconds. Therefore, an additional entry is provided to separately identify the change of state of both pins. At 43 nanoseconds (50 nanoseconds minus 7 nanoseconds) Pin B is in a 1 state. The next entry is the setting of Pin A to a 1 state. This occurs at 45 nanoseconds. As the hold times for Pin A and Pin B are different, again two entries are provided for the indication of a change of state of the pins. Thus, an entry is entered at 53 nanoseconds to indicate that Pin A, having a hold time of 3 nanoseconds, reverts to 0, while Pin B still is in a 1 state. At 54 nanoseconds, Pin B similarly reverts to 0. At 45 nanoseconds both Pin A and Pin B are in one state, indicating that Pin C should change to a one state at a time clock-to-output nanoseconds later. Therefore at 65 ns, Pin C changes to a 1 state.

This information is preferably stored in a core data structure from which a tester file is generated for a specific testing apparatus which physically tests a fabricated circuit. Thus, the tester will know when to assert certain signals at the inputs and monitor the change of state of signals at the outputs. Preferably the file is generated in a print-on-change format compatible with most testing devices. However, it is apparent that any format can be generated.

Figure 8:
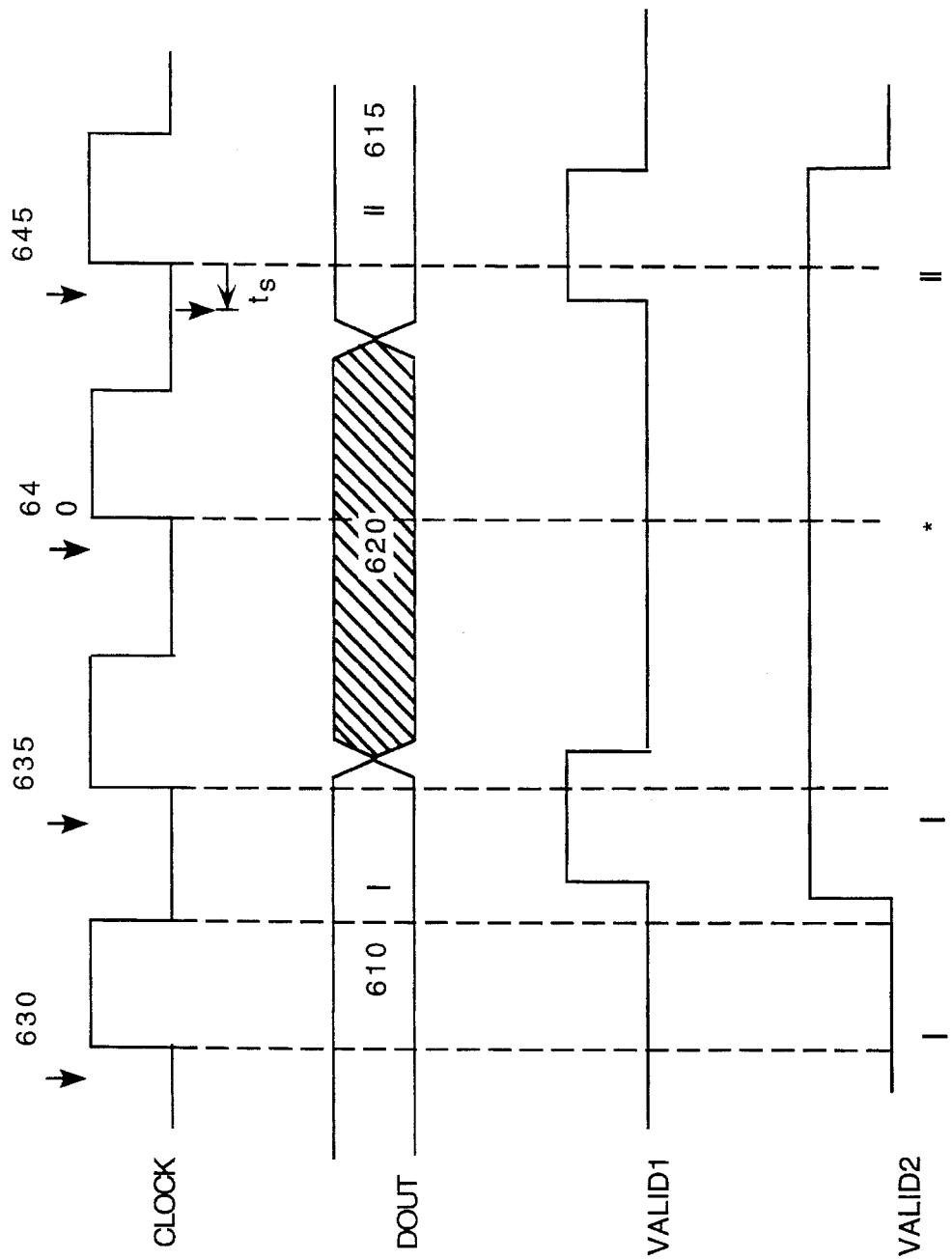
FIG. 8 is an exemplary timing diagram describing the masking function.

In addition to combining the test vector file with timing information, the combination module further has the capability to perform a dynamic masking of certain strobe signals. The masking function is described with reference to FIG. 8. The output signal DOUT1 is shown having two data valid signals 610, 615 separated by a short period of time 620 during which data is invalid. Data is specified to be valid for Chip 1 by the Valid 1 signal. During testing of the fabricated chip, the tester will strobe the input pin of Chip 1, which receives as input DOUT1, at each clock interval, for example, 630, 635, 640, 645. At strobe 640, however, the tester will sample invalid data. Subsequent testing of best case and worse case may cause the window of valid data 615 to shift such that at strobe 640, valid data is sampled. In order to avoid these inconsistencies, it is desirable to mask the strobe signal. Most commercial testers provide for masking of certain strobe signals by inserting a mask character in the file at the pin and time to be masked. However, this is typically done manually by editing of the tester file. To avoid this cumbersome and time consuming task, an innovative method for dynamically masking the testing of certain strobe signals at certain input/output pins is provided. Although the dynamic masking method and system is described in conjunction with the simulation and test system described herein, it is readily apparent that the dynamic masking can be applied to other simulation and test systems.

Preferably, an interpreter is utilized to interpret code which generally identifies the pins and strobe signals to mask. As a test file can include thousands (even hundreds of thousands of . . . ) of test vectors, this advantage to this ability is easily realized. The code includes at least one logic statement which identifies the signal which is referred to to determine whether to mask the strobe signal and the particular pin which is masked. For example, referring to FIG. 8, the logic statement may read:

FOR VAILD1. EQ. 1 THEN TURN ON MASK CHIP1, PIN 1;

FOR VALID1. EQ. 0 THEN TURN OFF MASK CHIP1, PIN1.

or may be in a format such as:

(VALID1=1)–(VALID1=0) PIN1;

Utilizing the timing information in the core data structure which identifies the timing of the strobe as well as the state of the VALID1 signal with respect to the strobe signal, the mask information can automatically be generated. Furthermore, the code can include multiple logic statements to identify masking with respect to a plurality of pins (see FIG. 5e).

In the preferred embodiment, a mask file, containing the code specifying the masking to be performed, is input to the combination module along with the test vector file and timing envelope specification. The combination module determines the masking information along with the timing information. At those pins and times at which masking is asserted, a code, such as a "*" or an "X" is inserted to identify a "don't care" with respect to the signal, thereby performing a masking function. When the test file is generated, this symbol is then converted to a mask symbol compatible with the tester format.

The combination module is further provided with the capability to accommodate loading which occurs when the fabricated circuit is tested. The system environment and simulation environment do not reflect the tester environment, particularly the loading which occurs when the circuit is connected to a tester for testing of the fabricated circuit. This is due to the problem that the simulation typically only provides for lumped capacitance and does not take into account the analog effects of loading on the transmission lines between components. The resultant effect is that the timing of a component may be different for each tester used.

Figure 9A:
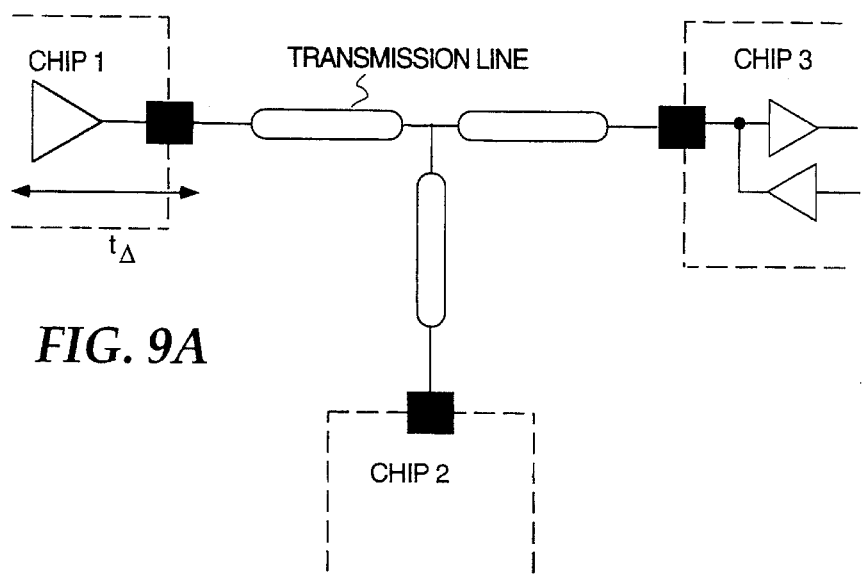
FIGS. 9a, 9b, 9c illustrate chip output load mapping performed in one embodiment of the method and apparatus of the present invention.
Figure 9B:
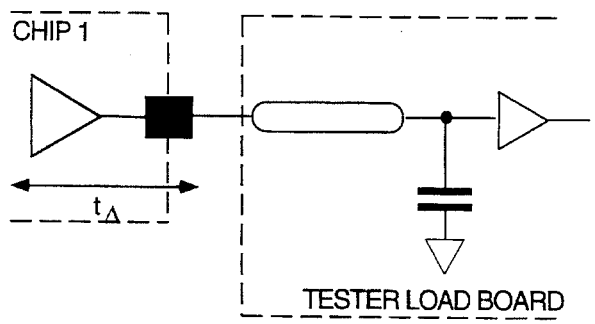
Figure 9C:
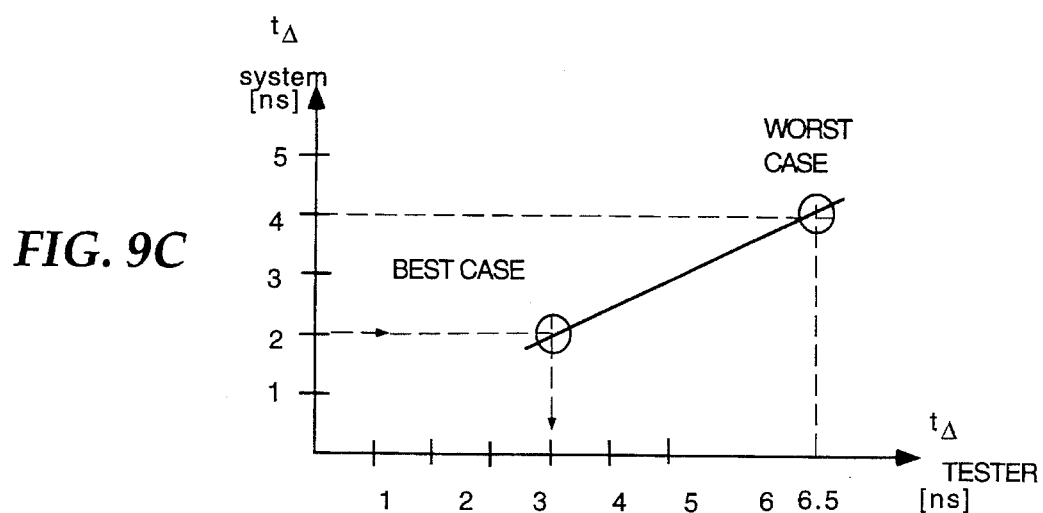

To eliminate these discrepancies, load mapping is performed. This is explained with reference to FIGS. 9 and 10. For signal propagation access, for example, transmission lines a pair of measurements for best case and worse case in each environment are generated. These measurements are generated by modifying the environment parameters which affects the best case and worse case measurements, such as input voltages and temperature of operation, and measuring the delays caused by the variations. The measurements are plotted against each environment in order to determine a mapping between environments. Referring to FIG. 9a an illustrative system of three chips 905, 910, 915 connected by transmission lines 920, 925, 930 is shown. The loading 940 with respect to chip 1 905 is illustrated by FIG. 9b. FIG. 9c shows the mapping between the system and tester environments is generated as evidenced by the slope of the line 955 between the intersections of the best cases and worse cases in the system and tester environments. In the present example, an adjustment of the strobe time compensates for the loading of the tester. Therefore, if the tester strobe is adjusted to occur at 6.5 ns for tester loading, this ensure that the chip perform at a strobe time of 4 ns under system loading. Thus, the circuit in the system environment behaves as it will in the tester environment.

Figure 10A:
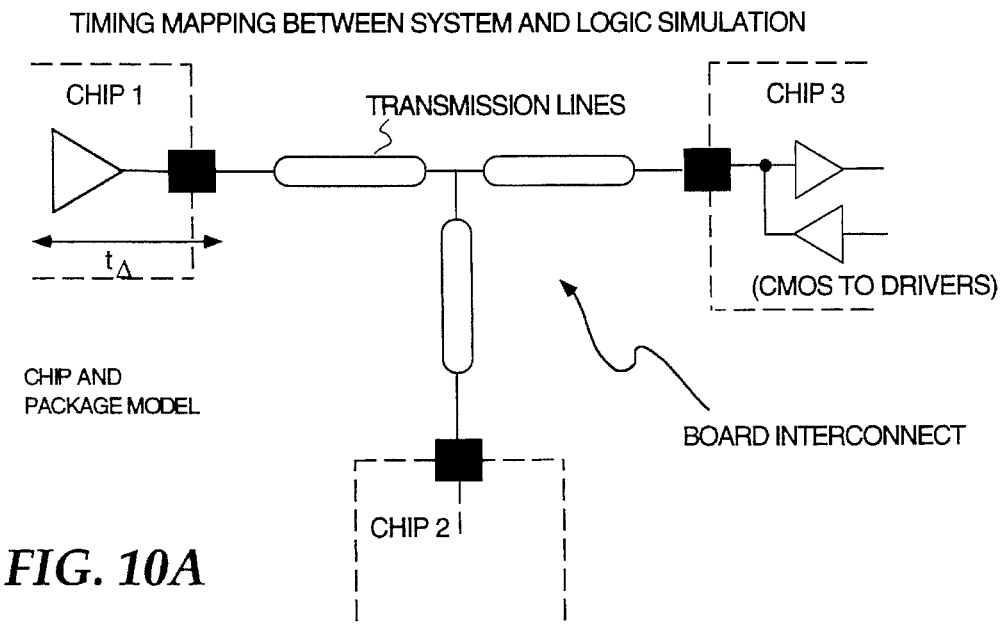
FIG. 10a, 10b, 10c illustrate load mapping performed in another embodiment of the method and apparatus of the present invention.
Figure 10B:
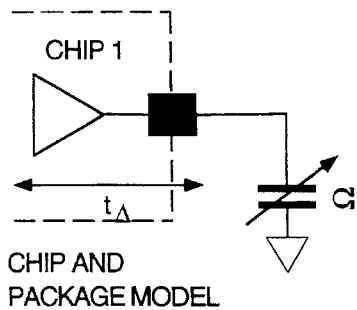
Figure 10C:
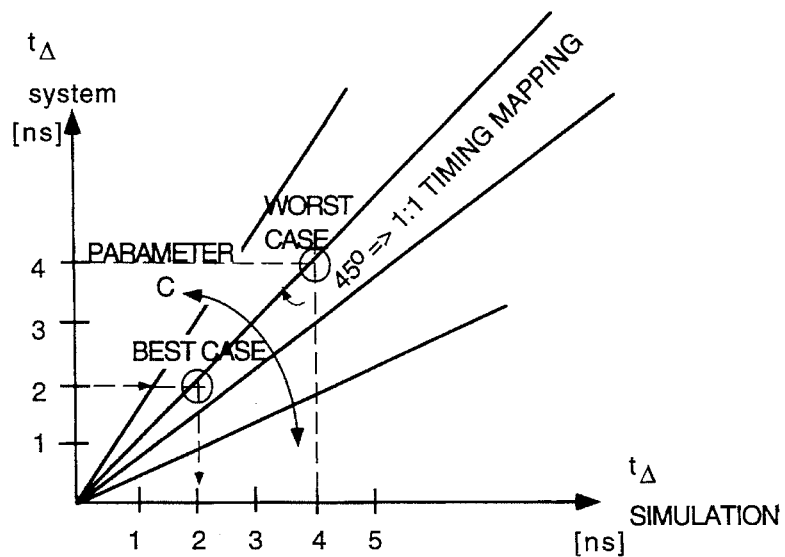

As noted above, a mapping can also be generated between the simulation and system environments. FIG. 10a illustrates the circuit in the system environment which includes components chip 1 1005, chip 2 1010, chip 3 1015 and transmission lines 1020, 1025, 1030. FIG. 10b illustrates the circuit with respect to chip 1 1005 and the loading due to the remainder of the circuit. In the example, the capacitance 1040 representing the loading of the remainder of the circuit is adjusted to match in both the system and simulation environments such that a curve mapping the timings of the two environments produce a curve having a slope of 45 degrees. This is illustrated by FIG. 10c which shows a plurality of mappings 1050, 1055, 1060, 1065 for different capacitance values. The capacitance is adjusted such that tΔ in the system and simulation environments match to produce a 45 degree curve, such as mapping 1055.

Although the present invention has been described in terms of the preferred embodiment, it will be appreciated that various modifications and alterations may be made by those skilled in the art without departing from the spirit and scope of the invention as set forth in the appended claims. The specification and drawings are, accordingly, to be regarded in an illustrative rather than a restrictive sense.

What is claimed is:

1. A process for testing electrical circuits comprising at least one circuit component comprising at least one element and comprising a plurality of input/output pins, each circuit having at least one timing envelope specification associated with the electrical circuit which identifies timing requirements of the components, said process comprising the steps of:

performing a timing verification of the electrical circuit in a system environment wherein timing for processing each component is compared to the timing envelope specification to determine that each pin of each component meets timing requirements specified by the timing envelope specification;

performing a functional verification of the electrical circuit wherein each component is assumed to process an electrical signal within a unit delay of a reference clock, said step of performing a functional verification verifies that logic elements of the electrical circuit logically operate as intended;

during the step of performing a functional verification, extracting a state of the input/output pins at each reference clock to generate a vector list identifying the state of each input/output pin at each reference clock;

combining the vector list and information from the timing envelope specification to generate a core data structure comprising data identifying the state of the input/output pins of the components at each time period when the input/output pins change state, said step of combining comprises the steps of, for each reference clock, identifying a state change time the reference clock occurs relative to a start time, for each pin that changes state at the reference clock, adjusting the state change time for each pin in accordance with the information in the timing envelope specification for each pin such that for each pin that changes state an adjusted state change time is identified for accurate identification of occurrence of a change of state relative to the start time, and storing in the core data structure timing vectors comprising the state of each pin and the adjusted state change time;

wherein the timing vectors are utilized as inputs to a test device which physically tests electrical circuits fabricated is generated from the core data structure.

2. The process as set forth in claim 1, further comprising the steps of:

if the electrical circuit does not meet the timing requirements specified by the timing envelope specification; adjusting the timing envelope specification such that the electrical circuit meets the timing requirements; and performing a timing verification of the electrical circuit to see if the adjusted timing envelope specification adjusted is sufficient for the electrical circuit to meet timing requirements.

3. The process as set forth in claim 1, further comprising the steps of:

if the electrical circuit does not meet the timing requirements specified by the timing envelope specification; modifying the electrical circuit;

performing a functional verification of the modified electrical circuit;

performing a timing verification of the modified electrical circuit; and iteratively performing the above steps until the functional verification and timing verification steps are complete.

4. The process as set forth in claim 1, further comprising the steps of:

extracting timing vectors from the core data structure;

modifying the extracted timing vectors to be in a format compatible with the test device; and adjusting the modified timing vectors to account for loading at the test device.

5. The process as set forth in claim 4, wherein the step of adjusting the modified timing vectors to account for loading at the test device comprises the steps of:

generating data identifying a best case and worst case timing of the electrical circuit as defined in the system environment;

generating data identifying a best case and worst case timing of the electrical circuit at the test device;

mapping the best case and worst case timing in the system environment against the best case and worst case timing at the test device;

adjusting time of strobe at which the test device tests the state of input/output pins to reflect a timing delay which occurs due to loading at the test device.

6. The process as set forth in claim 1, further comprising the steps of:

extracting component specific information from the core data structure and formatting the information in a vendor specific format for simulation of the component in a vendor specific environment;

providing a capacitive load on the input/output pins of the component to replace a remainder of the electrical circuit connected to the component, comprising the steps of;

generating data identifying a best case and worst case timing of each input/output pin of the component in the system environment; and adjusting the capacitive load which replaces the remainder of the electrical circuit in the vendor specific environment such that a mapping of timing of signals at the input/output pins in the system environment versus timing of signals at the input/output pins in the vendor specific environment with the capacitive load produces a curve having a slope of 45 degrees.

7. The process as set forth in claim 1, further comprising the step of:

identifying states of certain input/output pins and corresponding pins to be masked when certain input/output pins are in identified states such that the test device does not test for a state of the masked pins;

said step of combining further comprising the steps of;
   if certain input/output pins are in identified states at the adjusted state change time for a corresponding pin, masking the corresponding pin;

said core data structure maintaining masking information for masked pins when certain input/output pins are in an identified state;

wherein the vector list identifies pins to be masked at predetermined times in the test.

8. A system for testing electrical circuits comprising at least one component having at least one logic element and comprising a plurality of input/output pins, each circuit having at least one timing envelope specification associated with the electrical circuit which identifies the timing requirements of the components, said system comprising:

a timing verification sub-system for performing a timing verification in a system environment of the electrical circuit such that timing for processing each component is compared to the timing envelope specification to determine that each pin of each component meets timing requirements specified by the timing envelope specification;

a functional verification sub-system for performing a functional verification of the electrical circuit to verify that logic elements of electrical circuit operates as intended, wherein each component is assumed to process an electrical signal within a unit delay of a reference clock;

a collar which surrounds the system and each component and, during functional testing, extracts a state of the input/output pins at each reference clock to generate a vector list identifying the state of each input/output pin at each reference clock; and combination means which receives as inputs the vector list and information from the timing envelope specification for modifying the vector list using the timing envelope specification to generate a core data structure identifying the state of the input/output pins at each time period when the input/output pins change state, said combination means, at each reference clock, identifying a state change time the reference clock occurs relative to a start time, and for each pin that changes state at the reference clock, adjusting the state change time for each pin in accordance with the information in the timing envelope specification for each pin such that for each pin that changes state an adjusted state change time is identified for accurate identification of occurrence of a change of state relative to the start time, and storing in the core data structure timing vectors comprising the state of each pin and the adjusted state change time;

wherein said timing vectors are utilized to generate inputs to a test device which physically tests electrical circuits fabricated.

9. The system as set forth in claim 8, wherein information for vendor specific component simulation in a vendor specific environment and test vectors compatible with test device format are generated from the timing vectors.

10. The system as set forth in claim 9, further comprising an output interface for converting data from the timing vectors to the test device format and information for vendor specific component simulation.

11. The system as set forth in claim 10, wherein said output interface further comprises a means to generate strobe signals for testing the state of the input/output pins of a component, said means further comprising compensating means for compensating for test device loading, said compensating means comprising:

means for determining best case and worst case signal timing for each input/output pin in the system environment;

means for determining best case and worst case signal timing at the test device; and means for adjusting strobe timing such that strobe signals occur when data is available by mapping the best case and worst case signal timing in the system environment against the best case and worst case signal timing at the test device;

wherein physical testing errors caused by signal delays due to loading at the test device are avoided.

12. The system as set forth in claim 10, wherein said output interface further comprises means for compensating circuit loading on a component's input/output pins in the vendor specific environment, comprising a capacitive load placed on the input/output pins of the component to replace a remainder of the electrical circuit connected to the input/output pins of the component, said capacitive load determined by generating data identifying best case and worst case signal timing of each input/output pin of the component in the system environment, and adjusting the capacitive load which replaces the remainder of the electrical circuit in the vendor specific environment such that a mapping of timing of the input/output pins in the system environment versus timing of the input/output pins in the vendor specific environment with the capacitive load produces a curve having a slope of 45 degrees.

13. The system as set forth in claim 8, further comprising:

masking means for identifying states of certain input/output pins and corresponding input/output pins to be masked when certain input/output pins are in at least one identified state such that the test device does not test for a state of masked input/output pins;

said combining means generating masking information by masking a corresponding input/output pin if certain input/output pins are in identified states at the adjusted state change time for the corresponding pin; and said core data structure maintaining the masking information for masked input/output pins;

wherein the core data structure identifies input/output pins to be masked at predetermined times during a physical test by a test device.

14. The system as set forth in claim 13, wherein the masking means comprises a mask input file comprising logic statements identifying the states of certain input/output pins and specified input/output pins to be masked when certain input/output pins are in the at least one identified state.

15. A process for testing electrical circuits comprising at least one component having at least one logic element and comprising a plurality of input/output pins, each circuit having at least one timing envelope specification associated with the electrical circuit which identifies timing requirements of the components, said process comprising the steps of:

performing a timing verification of the electrical circuit in a system environment wherein timing for processing each component is compared to the timing envelope specification to determine that each pin of each component meets timing requirements specified by the timing envelope specification;

performing a functional verification of the electrical circuit to verify that logic elements of the electrical circuit operate as intended, wherein each component is assumed to process an electrical signal within a unit delay of a reference clock;

extracting a state of the input/output pins at each reference clock to generate a vector list identifying the state of each input/output pin at each reference clock;

modifying the vector list using the timing envelope specification to generate a test vector timing list identifying the state of input/output pins at each time period when input/output pins change state, said step of modifying comprises the steps of, for each reference clock, identifying a state change time the reference clock occurs relative to a start time, and for each pin that changes state at the reference clock, adjusting the state change time for each pin in accordance with information in the timing envelope specification for each pin such that for each pin that changes state an adjusted state change time is identified for accurate identification of occurrence of a change of state relative to the start time; and physically testing a fabricated electrical circuit by providing input signals and asserting strobe signals specified by the test vector timing list to test equipment to test the state of the input/output pins.

16. The process as set forth in claim 15, further comprising the step of compensating for test equipment loading, comprising the steps of:

determining best case and worst case signal timing for each input/output pin in the system environment;

determining best case and worst case signal timing in a test equipment environment; and adjusting strobe timing such that strobe signals occur when data is available by mapping the best case and worst case signal timing in the system environment against the best case and worst case signal timing in the test equipment environment;

wherein physical testing errors caused by signal delays due to loading at the test equipment are avoided.

17. The process as set forth in claim 15, further comprising the step of generating from the test vector timing list simulation data in a format compatible with a vendor specific simulation environment of a component.

18. The process as set forth in claim 17, further comprising the step of compensating for circuit loading on a component's input/output pins in the vendor specific simulation environment of the component, by replacing a remainder of the electrical circuit with a capacitive load on the input/output pins of the component reflective of the circuit loading, said capacitive load determined by generating data identifying best case and worst case signal timing of each input/output pin of the component in the system environment, and adjusting the capacitive load which replaces the remainder of the electrical circuit in the vendor specific simulation environment such that a mapping of timing of the input/output pin in the system environment versus timing of the input/output pin in the vendor specific simulation environment with the capacitive load produces a curve having a slope of 45 degrees.

19. The process as set forth in claim 15, further comprising the steps of:

identifying states of certain input/output pins and corresponding input/output pins to be masked when certain input/output pins are in identified states such that the test equipment does not test for the state of masked input/output pins;

if certain input/output pins are in identified states at the adjusted state change time for a corresponding pin, providing an indication to mask the corresponding pin; and masking specified input/output pins at the adjusted state change time for the corresponding pin when physically testing the component.

20. The process as set forth in claim 19, wherein the step of identifying states of corresponding input/output pins to be masked comprises the step of generating logic statements using certain input/output pin states to identify when the corresponding input/output pins are to be masked.

21. A system for testing electrical circuits comprising at least one component having at least one logic element and comprising a plurality of input/output pins, each circuit having at least one timing envelope specification associated with the electrical circuit which identifies timing requirements of the component, said system comprising:

a timing verification sub-system for performing a timing verification of the electrical circuit such that timing for processing each component is compared to the timing envelope specification to determine that each pin of each component meets timing requirements specified by the timing envelope specification;

a functional verification sub-system for performing a functional verification of an electrical circuit to verify that logic elements of the electrical circuit operate as intended wherein each component is assumed to process an electrical signal within a unit delay of a reference clock;

a collar which surrounds the system and each component and, during functional testing, extracts the state of the input/output pins at each reference clock to generate a vector list identifying a state of each pin at each reference clock;

combination means which receives as inputs the vector list and information from the timing envelope specification for modifying the vector list using the timing envelope specification to generate a test vector timing list identifying the state of the input/output pins at each time period an input/output pin changes state, said combination means, at each reference clock, identifying a state change time the reference clock occurs relative to a start time, and for each pin that changes state at the reference clock, adjusting the state change time for each pin in accordance with the information in the timing envelope specification for each pin such that for each pin that changes state an adjusted state change time is identified for accurate identification of occurrence of a change of state relative to the start time, and storing in the test vector timing list vectors comprising the state of each pin and the adjusted state change time; and a physical test device to physically test fabricated electrical circuits utilizing the test vector timing list to identify when to assert signals at specified input pins from the plurality of input/output pins and when to detect certain output states at specified output pins from the plurality of input/output pins.

22. In a tester environment in which a component is physically tested by inputting signals and asserting strobe signals to test a state of certain input/output pins of the component, said component designed to operate in a circuit coupled to the input/output pins of the component, said circuit verified in a system environment which does not account for timing delays caused by loading at tester, a process for compensating for loading at the tester, comprising the steps of, for each input/output pin:

determining best case and worst case signal timing for the input/output pin in the system environment;

determining best case and worst case signal timing for the input/output pin in the tester environment; and adjusting strobe timing at the input/output pin such that strobe signals occur when data is available by mapping the best case and worst case signal timing in the system environment against the best case and worst case signal timing in the tester environment and adjusting the strobe timing to compensate for a difference between the best case and worst case signal timing in the system environment and the best case and worst case signal timing in the tester environment;

wherein physical testing errors caused by signal delays due to loading at the tester are avoided.

23. In a tester environment in which a component is physically tested by inputting signals and asserting strobe signals to test a state of certain input/output pins of the component, said component designed to operate in a circuit coupled to the input/output pins of the component, said circuit verified in a system environment, a process for dynamically masking strobe signals at certain input/output pins of the component, comprising the steps of:

identifying states of certain input/output pins and corresponding pins to be masked when certain input/output pins are in identified states such that the tester does not test for the state of the masked pins, said step comprising forming logic statements using certain input/output pin states to identify when corresponding pins are to be masked;

generating a masking code to mask corresponding pins at certain times during testing from the logic statements which identify certain input/output pin states during which corresponding pins are masked; and masking corresponding pins when certain pins are in an identified state when physically testing the component.

24. In a vendor specific simulation environment in which a component is simulated using vendor specific libraries of elements and processes, said component designed to operate in a circuit coupled to the input/output pins of the component, said circuit verified in a system environment which did not utilize vendor specific libraries and processes, a process for accurately simulating the component as connected to the circuit without simulating the circuit, comprising the step of compensating for circuit loading on a component's input/output pins in the vendor specific simulation environment of the component, by replacing a remainder of the circuit with a capacitive load on the input/output pins of the component reflective of the circuit loading of the remainder of the circuit, said capacitive load determined by generating data identifying a best case and worst case signal timing of each input/output pin of the component in the system environment, and adjusting the capacitive load which replaces the remainder of the circuit in the vendor specific simulation environment such that a mapping of the best case and worst case signal timing of the input/output pins in the system environment versus the best case and worst case signal timing of the input/output pins in the vendor specific simulation environment with the capacitive load produces a curve having a slope of 45 degrees.

\* \* \* \* \*

UNITED STATES PATENT AND TRADEMARK OFFICE
CERTIFICATE OF CORRECTION

PATENT NO. : 5,535,223
DATED : July 9, 1996
INVENTOR(S) : Horstmann et al.

It is certified that error appears in the above-identified patent and that said Letters Patent is hereby corrected as shown below:

In column 10, claim 2 at line 1, please delete " adjusted ".

In column 11, claim 7 at line 5, please delete " in the test " and insert -- during a physical test by a test device --.

Signed and Sealed this

Fourth Day of January, 2000

Attest:

Attesting Officer

Acting Commissioner of Patents and Trademarks